United States Patent
Her

(10) Patent No.: US 9,501,199 B2
(45) Date of Patent: Nov. 22, 2016

(54) TOUCH WINDOW AND TOUCH DEVICE INCLUDING THE SAME

(71) Applicant: LG INNOTEK CO., LTD., Seoul (KR)

(72) Inventor: Jae Hak Her, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 44 days.

(21) Appl. No.: 14/468,638

(22) Filed: Aug. 26, 2014

(65) Prior Publication Data

US 2015/0062465 A1    Mar. 5, 2015

(30) Foreign Application Priority Data

Aug. 27, 2013    (KR) .................. 10-2013-0101614

(51) Int. Cl.
*G06F 3/045* (2006.01)
*G06F 3/044* (2006.01)
*H05K 1/03* (2006.01)
*B82Y 10/00* (2011.01)

(52) U.S. Cl.
CPC ............. *G06F 3/045* (2013.01); *G06F 3/044* (2013.01); *H05K 1/0393* (2013.01); *B82Y 10/00* (2013.01); *G06F 2203/04103* (2013.01); *H05K 2201/0326* (2013.01); *H05K 2201/05* (2013.01); *H05K 2201/10128* (2013.01); *Y10S 977/952* (2013.01)

(58) Field of Classification Search
CPC .................. G06F 3/045; G06F 3/044; G06F 2203/04103; H05K 1/0393; H05K 2201/0326; H05K 2201/10128; H05K 2201/05; B82Y 10/00; Y10S 977/952
See application file for complete search history.

(56) References Cited

U.S. PATENT DOCUMENTS

| | | | |
|---|---|---|---|
| 2002/0149572 A1 | 10/2002 | Schulz et al. | |
| 2008/0303782 A1 | 12/2008 | Grant et al. | |
| 2009/0153521 A1 | 6/2009 | Jiang et al. | |
| 2012/0127112 A1 | 5/2012 | Lu et al. | |
| 2013/0002133 A1* | 1/2013 | Jin | G06F 1/169 313/511 |
| 2013/0181925 A1 | 7/2013 | Kim et al. | |
| 2013/0265257 A1* | 10/2013 | Jung | G06F 3/0412 345/173 |
| 2013/0293096 A1* | 11/2013 | Kang | H01H 1/10 313/511 |
| 2014/0145977 A1* | 5/2014 | Kang | G06F 3/044 345/173 |
| 2014/0204285 A1* | 7/2014 | Jang | G06F 3/044 349/12 |
| 2015/0022492 A1 | 1/2015 | Park et al. | |
| 2015/0029150 A1 | 1/2015 | Lee | |

FOREIGN PATENT DOCUMENTS

| | | |
|---|---|---|
| EP | 2 827 230 A1 | 1/2015 |
| EP | 2833235 | 2/2015 |

OTHER PUBLICATIONS

European Search Report dated Nov. 10, 2015 issued in Application No. 14 182 146.2.
European Search Report dated Mar. 10, 2015 issued in Application No. 14182146.2.
European Office Action for Application 14 182 146.2 dated Jul. 28, 2016.

* cited by examiner

*Primary Examiner* — Liliana Cerullo
(74) *Attorney, Agent, or Firm* — KED & Associates LLP

(57) ABSTRACT

Disclosed are a touch window and a touch device including the same. The touch window includes first and second areas, wherein the second area is bendable from the first area.

14 Claims, 7 Drawing Sheets

TOUCH WINDOW AND TOUCH DEVICE INCLUDING THE SAME

CROSS-REFERENCE TO RELATED APPLICATION

This application claims priority under 35 U.S.C. §119 to Korean Application No. 10-2013-0101614 filed on Aug. 27, 2013, whose entire disclosure is hereby incorporated by reference.

BACKGROUND

1. Field

The disclosure relates to a touch window and a touch device including the same.

2. Background

Recently, a touch window, which performs an input function through the touch of an image displayed on a touch device by an input device such as a stylus pen or a hand, has been applied to various electronic appliances.

The touch window may be typically classified into a resistive touch window and a capacitive touch window. In the resistive touch window, the position of the touch point is detected by detecting the variation of resistance according to the connection between electrodes when pressure is applied to an input device. In the capacitive touch window, the position of the touch point is detected by detecting the variation in capacitance when a finger of the user touches the capacitive touch window between electrodes. When taking into consideration the convenience of a fabrication scheme and a sensing power, the capacitive touch window has been spotlighted in a smaller model touch window recently.

Meanwhile, the demand for a flexible touch window has been increased recently. That is, if the touch window is flexible or bendable, the experience of a user will extend.

The above references are incorporated by reference herein where appropriate for appropriate teachings of additional or alternative details, features and/or technical background.

SUMMARY

The embodiment is to provide a touch window which is flexible, and a touch device including the same.

The touch window according to the embodiment includes first and second areas, wherein the second area is bendable from the first area.

The embodiment may provide a touch window of which the structure may be modified in various structures. That is, a wide screen may be provided when a touch window is used, and a size of the touch window may be greatly reduced through the second area when the touch window is carried. Thus, a large size of screen and portability may be secured together.

BRIEF DESCRIPTION OF THE DRAWINGS

The embodiments will be described in detail with reference to the following drawings in which like reference numerals refer to like elements wherein.

DETAILED DESCRIPTION

Figure 1:
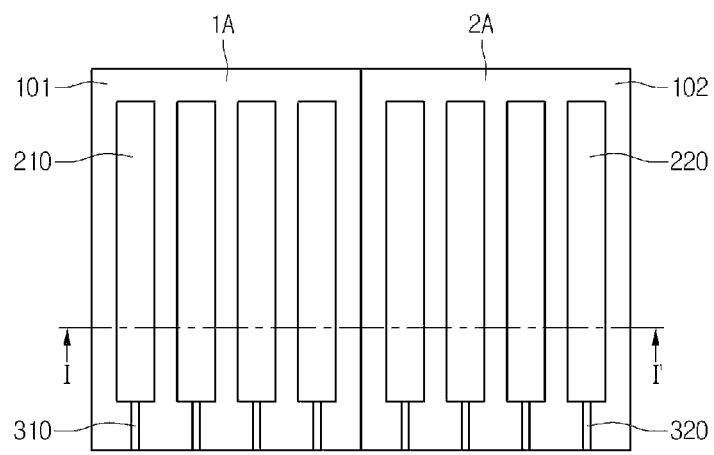
FIG. 1 is a plan view showing a touch window according to an embodiment.

In the following description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, the embodiment will be described with reference to accompanying drawings.

Figure 2:
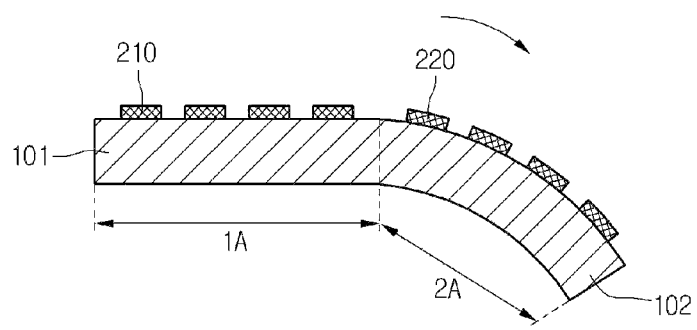
FIG. 2 is a sectional view taken along line I-I' of FIG. 1.
Figure 3:
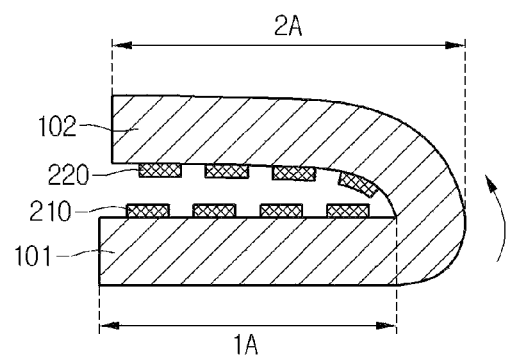
FIG. 3 is a sectional view showing a touch window according to another embodiment.

First, a touch window according to an embodiment will be described with reference to FIGS. 1 to 3. FIG. 1 is a plan view showing the touch window according to the embodiment. FIG. 2 is a sectional view taken along line I-I' of FIG. 1. FIG. 3 is a sectional view showing a touch window according to another embodiment.

Referring to FIGS. 1 to 3, the touch window according to the embodiment may include a substrate including first and second areas 1A and 2A. In detail, the substrate 101 may include a first substrate 101 including the first area 1A and a second substrate 102 including the second area 2A. The first and second substrates 101 and 102 may be formed integrally with each other. The first area 1A may be fixed in the touch window.

A first sensing electrode 210 and a first wire 310 may be provided on the first substrate 101 including the first area 1A.

The first substrate 101 may be formed of various materials which may support the first sensing electrode 210 and the first wire 310 which are formed on the first substrate 101. The first substrate 101 may include a glass substrate or a plastic substrate including a polyethylene terephthalate (PET) film or resin.

The first sensing electrode 210 may include a first material. The first material may include transparent conductive film. For example, the first material may include metal oxide such as indium tin oxide, indium zinc oxide, copper oxide, tin oxide, zinc oxide or titanium oxide. The first material may be a material very useful for visibility without interrupting transmission of light.

The first wire 310 is electrically connected to the first sensing electrode 210. The first wire 310 may be connected to at least one of ends of the first sensing electrode 210. The first wire 310 may be formed of metal having superior electric conductivity. For example, the first wire 310 may include chrome (Cr), nickel (Ni), copper (Cu), aluminum (Al), silver (Ag), molybdenum (Mo), and an alloy thereof.

Specifically, the first wire 310 may include various metallic paste materials which can be formed through a printing process.

The second substrate 102 may be disposed to be adjacent to the first substrate 101. That is, the second area 2A may be disposed to be adjacent to the first area 1A. The second substrate 102 may be warped or bent from the first substrate 101. That is, the second area 2A may be bent from the first area 1A. The second area 2A may be bent from the first area 1A.

As shown in FIG. 2, the second area 2A may be bent downwardly from the first area 1A. In addition, as shown in FIG. 3, the second area 2A may be bent upwardly from the first area 1A.

In addition, although not shown in the drawings, the second area 2A may slide from the first area 1A.

A second sensing electrode 220 and a second wire 320 may be disposed on the second substrate 102 including the second area 2A.

The second substrate 102 may be formed of a plastic substrate including a polyethylene terephthalate (PET) film or resin. The second substrate 102 may have a flexible property.

The second sensing electrode 220 may include a second material different from the first material. For example, the second material may include an interconnecting structure, a carbon nano tube (CM), graphene or various metals.

For example, when the second sensing electrode 220 includes the interconnecting structure, the interconnecting structure may be a micro-structure having a diameter of 10 nm to 200 nm. In this case, the second sensing electrode 220 may include a nanowire.

In addition, when the sensing electrode 220 includes a metal, the sensing electrode 220 may include chrome (Cr), nickel (Ni), copper (Cu), aluminum (Al), silver (Ag), molybdenum (Mo) and an alloy thereof.

Figure 4:
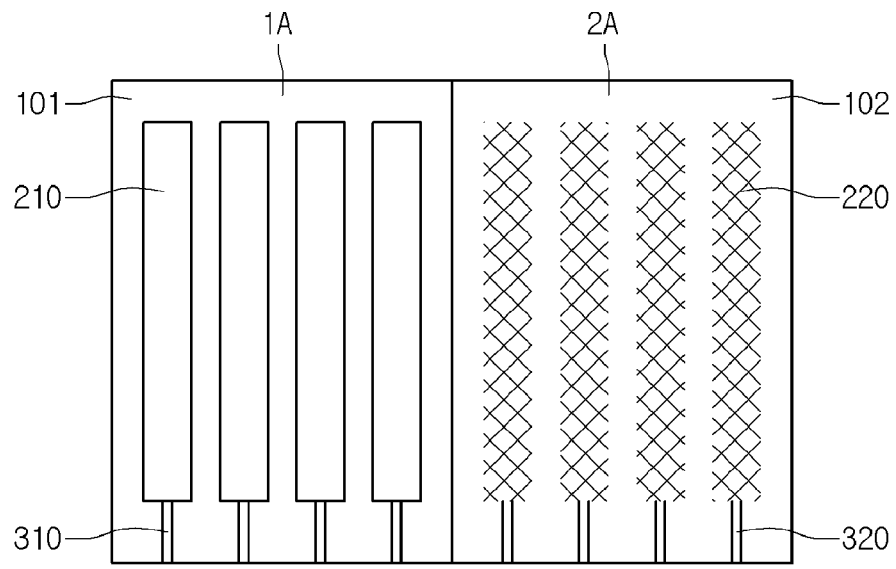
FIGS. 4 and 5 are plan views showing a touch window according to another embodiment.

The second material has a flexible property so that the second material may be suitable to be applied to the substrate having the bending or warping property. Meanwhile, referring to FIG. 4, when the second sensing electrode 220 is formed of a metallic material, the second sensing electrode 220 may include a conductive pattern. For example, the second sensing electrode 220 may be disposed in a mesh shape. Thus, the visibility may be secured. In this case, the mesh pattern may be formed in random to prevent a moiré phenomenon. The moiré phenomenon occurs when periodical stripes overlap with each other. Since adjacent stripes overlap with each other, a thickness of a stripe is thickened so that the stripe is spotlighted as compared with other stripes. Thus, in order to prevent such a moiré phenomenon, the conductive pattern may be provided in various shapes.

Meanwhile, when the second sensing electrode 220 has a mesh shape, a line width of the mesh line may be in the range of 0.1 μm to 10 μm. It may be impossible in terms of the manufacturing process to form the mesh line having the line width less than 0.1 μm. When the line width is 10 μm or less, the pattern of the second sensing electrode 220 may be invisible. Preferably, the line width of the mesh line may be in the range of 1 μm to 10 μm about 1 μm to about 5 μm or about 1.5 μm to about 3 μm.

The second sensing electrode 220 may include the second material having a flexible property, so that the second sensing electrode 220 may be flexible without any physical damages.

The second wire 320 is electrically connected to the second sensing electrode 220. The second wire 320 may be connected to at least one of ends of the second sensing electrode 220. The second wire 320 may be formed of metal having superior electric conductivity. For example, the second wire 320 may include chrome (Cr), nickel (Ni), copper (Cu), aluminum (Al), silver (Ag), molybdenum (Mo) and an alloy thereof. Specifically, the second wire 320 may include various metallic paste materials which can be formed through a printing process.

The second wire 320 may be disposed on the flexible second substrate 100. In detail, the second wire 320 may be disposed on the second area 2A. Further, only the second wire 320 or the sensing electrode 220 and the second wire 320 together may be disposed on the second area 2A, that is, the bent area 2A of the second substrate.

As shown in FIGS. 2 and 3, the embodiment may provide a touch window which may be easily portable and of which the structure may be modified in various structures. That is, a wide screen may be provided when a touch window is used, and a size of the touch window may be greatly reduced through the second area 2A when the touch window is carried. Thus, a large size of screen and portability may be secured together.

Meanwhile, FIG. 1 shows the sensing electrodes 210 and 220 extending in one direction, but the embodiment is not limited thereto.

In detail, the first and second electrode 210 and 220 may include first and second sub-sensing electrodes extending in mutually different directions.

The first and second sub-sensing electrodes may be disposed in various schemes according to a touch window structure.

For example, the first and second sub-sensing electrodes may be disposed on the same surface of the substrate.

In detail, the substrate may include a cover substrate including glass or strengthened glass. The first and second sub-sensing electrodes may be disposed on the same surface of the cover substrate In addition, a cover substrate may be further provided on the substrate and the first and second sub-sensing electrodes may be disposed on the same surface of the substrate. In addition, the first and second sub-sensing electrodes may be disposed on mutually different surfaces of the substrate.

In detail, the first sub-sensing electrode may be disposed on one surface of the substrate and the second sub-sensing electrode may be disposed on the opposite surface of the substrate.

In addition, a middle layer, that is, a dielectric layer may be further disposed on the substrate and a cover substrate may be further disposed on the dielectric layer. One of the first and second sub-sensing electrodes may be disposed on the substrate and the other may be disposed on the dielectric layer.

In addition, a cover substrate may be further disposed on the substrate. One of the first and second sub-sensing electrodes may be disposed on the cover substrate and the other may be disposed on the substrate.

In addition, another substrate may be further disposed on the substrate and a cover substrate may be disposed on the another substrate. One of the first and second sub-sensing electrodes may be disposed on the substrate and the other may be disposed on another substrate.

Hereinafter, a touch window according to another embodiment will be described with reference to FIGS. 5 to 7. In the following description about the touch window according to another embodiment, the parts similar or identical to those of the previously described embodiment will be omitted for the purpose of clear and brief description.

Figure 5:
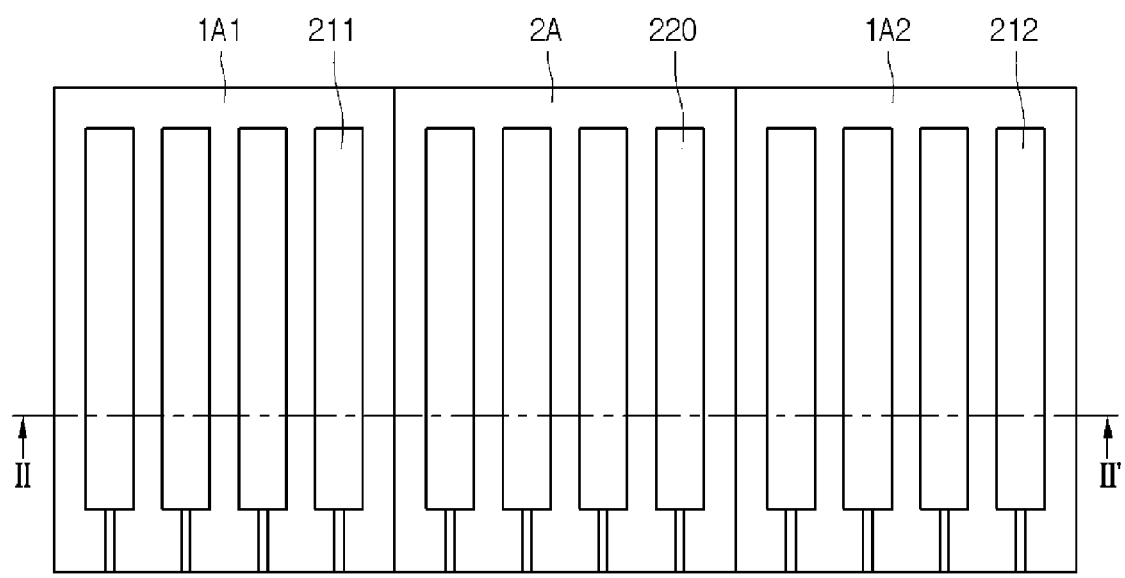
Figure 6:
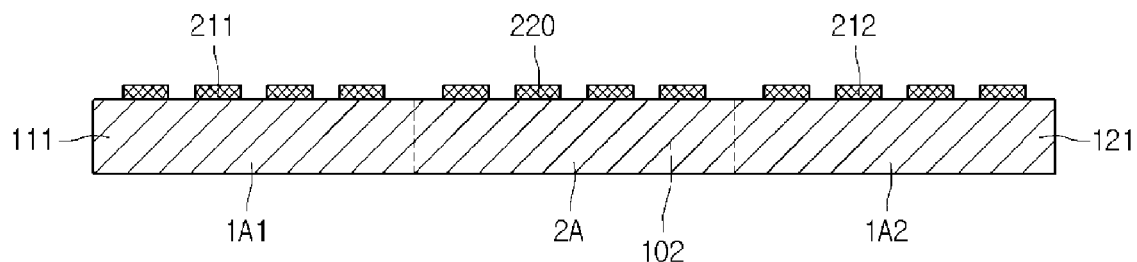
FIGS. 6 and 7 are sectional views taken along line II-II' of FIG. 5.
Figure 7:
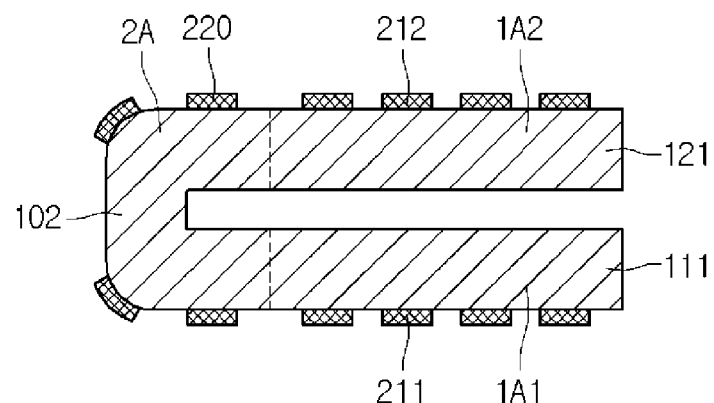

Referring to FIGS. 5 to 7, a touch window according to another embodiment includes two first areas 1A1 and 1A2 disposed at both sides of the second area 2A. That is, the second area 2A, which is flexible, may be interposed between the two first areas 1A1 and 1A2.

Referring to FIG. 7, since the second area 2A is bendable, a foldable touch window may be implemented. When the touch window is used, as shown in FIGS. 5 and 6, the touch window may be unfolded to use a wide screen. When carried, as shown in FIG. 7, the second area 2A is bent so that the size may be reduced. Thus, a large size of screen may be secured and at the same time, portability may be ensured.

In addition, while the touch window is used or carried, as shown in FIG. 7, the second area may be bent so that a bent touch window may be implemented. Hereinafter, referring to FIGS. 8 and 9, a touch window according to still another embodiment will be described.

Figure 8:
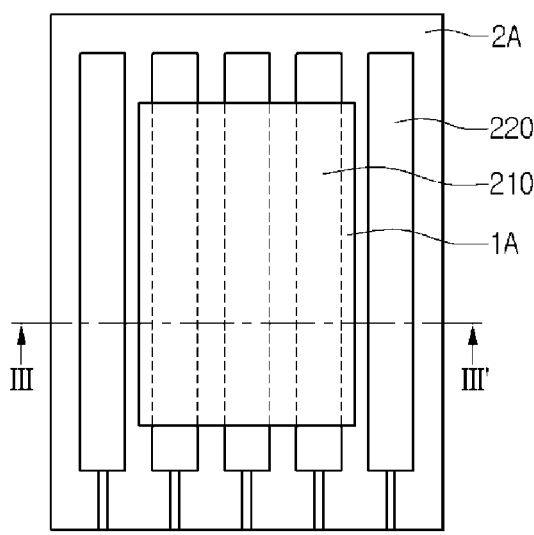
FIG. 8 is a plan view showing a touch window according to another embodiment.
Figure 9:
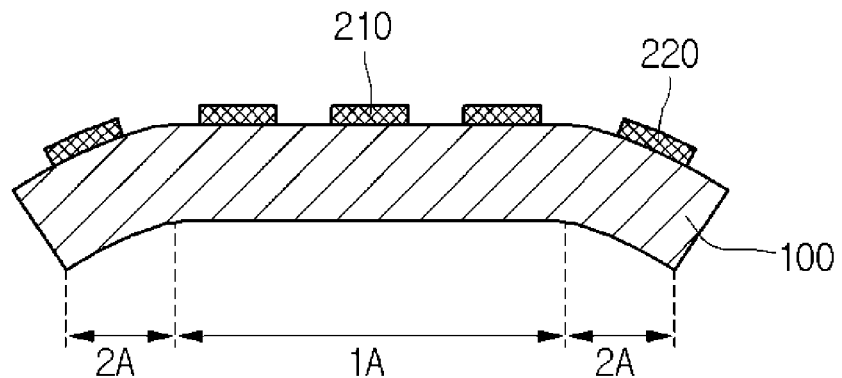
FIG. 9 is a sectional view taken along line III-III' of FIG. 8.

Referring to FIGS. 8 and 9, the second region 2A, which is a bendable area, surrounds the first area 1A which is a fixed area. That is, the second area 2A is disposed at an outside of the first area 1A. Referring to FIG. 9, the second area 2A may be bent from the first area 1A, so that the grip sensitivity of the touch window may be improved.

Figure 10:
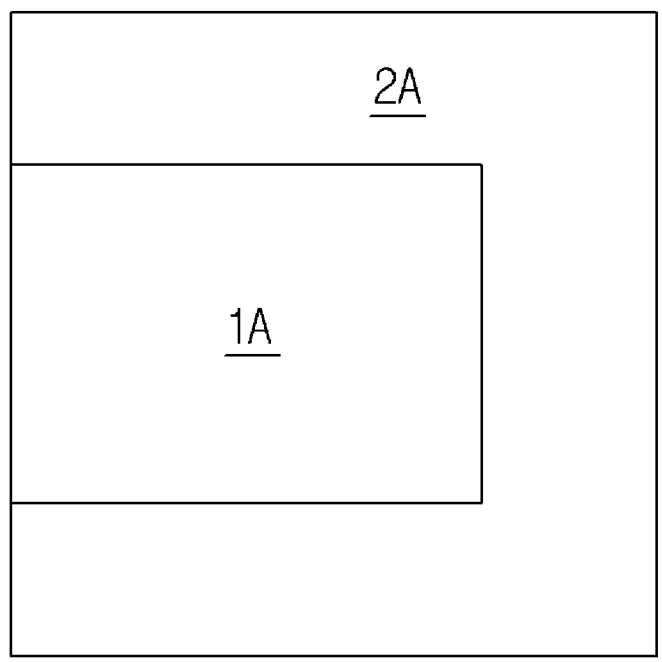
FIGS. 10 and 11 are schematic plan views showing a touch window according to another embodiment.
Figure 11:
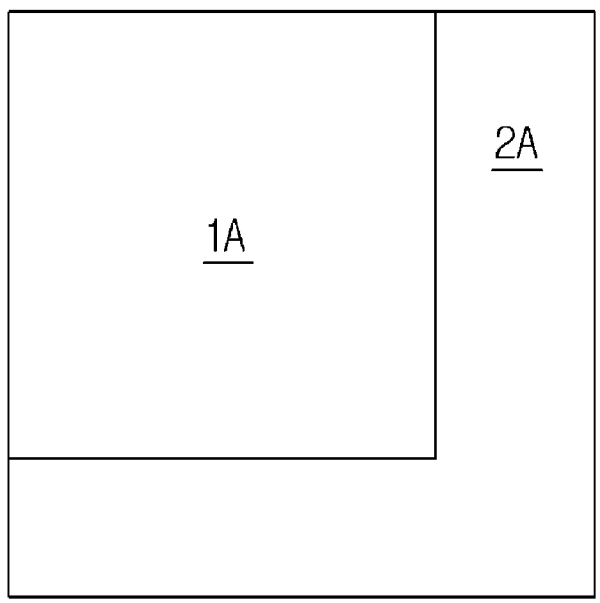

Meanwhile, as shown in FIGS. 10 and 11, the first and second areas 1A and 2A may be variously disposed. That is, as shown in FIG. 10, the second area 2A may not be disposed on anyone side surface of the first area 1A. The second area 2A may be disposed on three among four side surfaces of the first area 1A.

In addition, referring to FIG. 11, the second area 2A may be disposed on only two among the four side surfaces of the first area 1A.

The embodiment is not limited to the above, but the second area 2A may be disposed on at least one side surface of the first area 1A.

Thus, a structural diversity of the bendable touch window may be secured.

Figure 12:
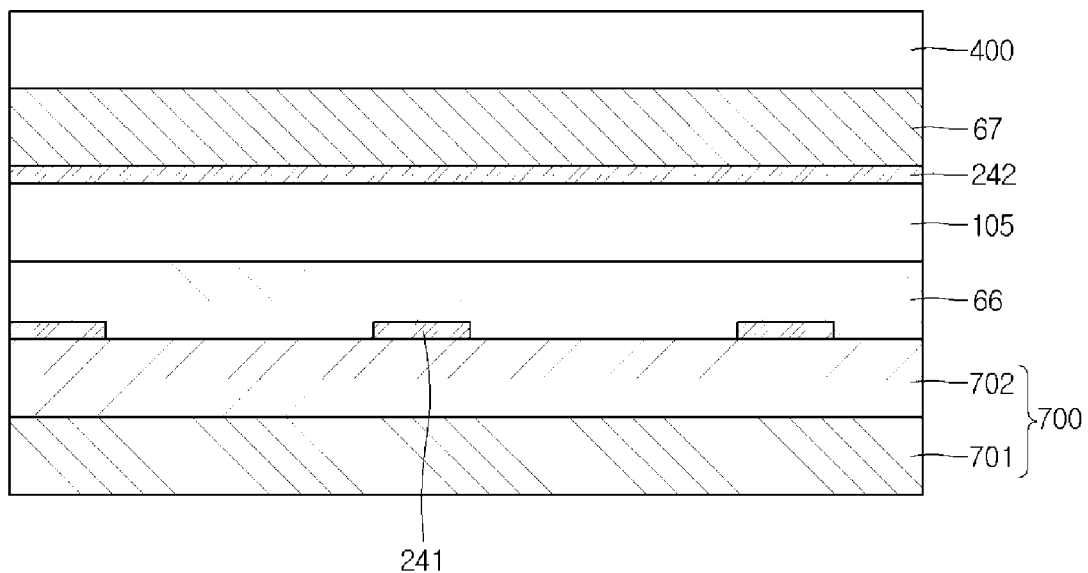
FIGS. 12 to 17 are sectional views showing a touch device in which the touch window according to the embodiment is disposed on a display panel according to various embodiments.
Figure 13:
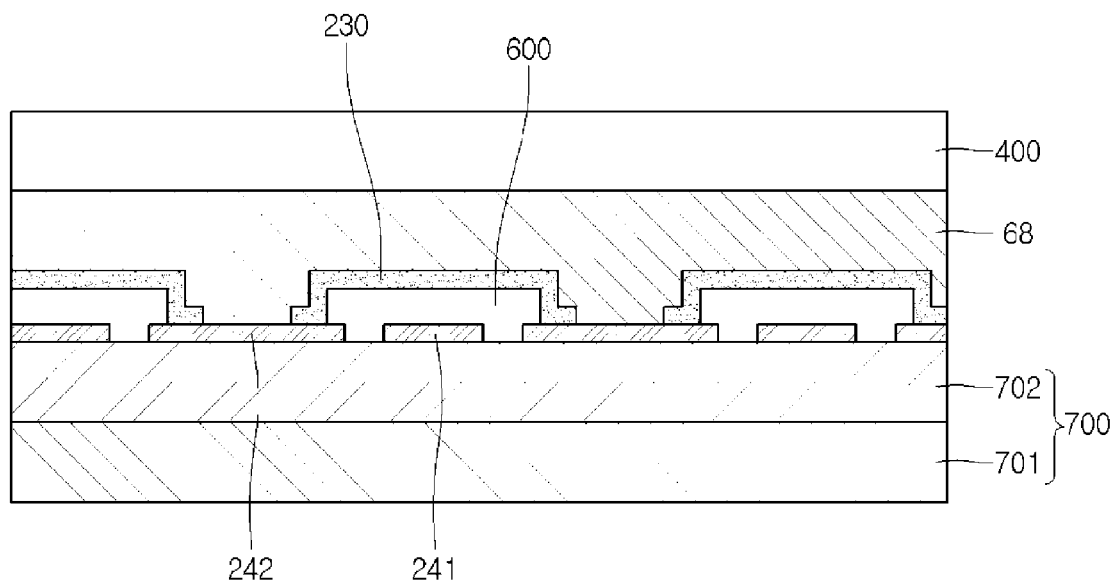

Referring to FIGS. 12 and 13, a touch device according to the embodiment may include a touch window formed integrally with a display panel 700. In other words, a substrate to support at least one sensing electrode may be omitted.

In detail, at least one sub-sensing electrode may be formed on at least one surface of the display panel 700. The display panel 700 includes first and second substrates 701 and 702. In other words, at least one sub-sensing electrode may be formed on at least one surface of the first substrate 701 or the second substrate 702.

If the display panel 700 is a liquid crystal display panel, the display panel 700 may be formed in a structure that the first substrate 701 including a thin film transistor (TFT) and a pixel electrode and the second substrate 702 including color filters are combined with each other while interposing a liquid crystal layer therebetween.

In addition, the display panel 700 may include a liquid crystal display panel having a color filter on transistor (COT) structure in which a TFT, a color filter, and a black matrix are formed on the first substrate 701, and the second substrate 702 is combined with the first substrate 701 while interposing a liquid crystal layer between the second substrate 702 and the first substrate 701. In other words, the TFT may be formed on the first substrate 701, a protective layer may be formed on the TFT, and the color filter lay may be formed on the protective layer. In addition, a pixel electrode making contact with the TFT is formed on the first substrate 701. In this case, the black matrix may be omitted to improve an opening ratio and to simplify a mask process, and a common electrode may perform both of the inherent function thereof and the function as the black matrix.

In addition, if the display panel 700 is the liquid crystal display panel, a display device may further include a backlight unit to provide light to a bottom surface of the display panel 700.

If the display panel 700 is an organic electroluminescence display panel, the display panel 700 includes a self-emissive device that does not require an additional light source. The display panel 700 includes the first substrate 701 formed thereon with a TFT and an organic light emitting device making contact with the TFT. The organic light emitting device may include an anode, a cathode, and an organic light emitting layer interposed between the anode and the cathode. In addition, the second substrate 702, which serves as an encapsulation substrate for encapsulation, may be further provided on the organic light emitting device.

In this case, at least one sub-sensing electrode may be formed on a top surface of an upper substrate. Although the sub-sensing electrode is formed on the top surface of the second substrate 702 in the drawings, when the first substrate 701 serves as the upper substrate, at least one sub-sensing electrode may be formed on the top surface of the first substrate 701.

Referring to FIG. 12, the first sub-sensing electrode 241 may be formed on the top surface of the display panel 700. In addition, a first wire connected with the first sub-sensing electrode 241 may be formed. A touch substrate 105 having the second sub-sensing electrode 242 and the second wire may be formed on the display panel 700 having the first sub-sensing electrode 241. A first bonding layer 66 may be interposed between the touch substrate 105 and the display panel 700.

Although the drawing shows that the second sub-sensing electrode 242 is formed on the top surface of the touch substrate 105, and a cover substrate 400 is formed on the touch substrate 105 while interposing a second bonding layer 67 between the touch substrate 105 and the cover substrate 400, the embodiment is not limited thereto. The second sub-sensing electrode 242 may be formed on a bottom surface of the touch substrate 105. In this case, the touch substrate 105 may serve as the cover substrate.

In other words, the embodiment is not limited to the structure shown in the drawing, but various modifications are possible if the first sub-sensing electrode 241 is formed on a top surface of the display panel 700, the touch substrate 105 to support the second sub-sensing electrode 242 is disposed on the display panel 700, and the touch substrate 105 is combined with the display panel 700.

In addition, the touch substrate 105 may include a polarizer. In other words, the second sub-sensing electrode 242 may be formed on top and bottom surfaces of the polarizer. Accordingly, the second sub-sensing electrode 242 may be formed integrally with the polarizer.

In addition, the polarizer may be provided independently from the touch substrate 105. In this case, the polarizer may be disposed under the touch substrate 105. For example, the polarizer may be interposed between the touch substrate 105 and the display panel 700. In addition, the polarizer may be disposed above the touch substrate 105.

The polarizer may include a linear polarizer or an antireflective polarizer for external light. For example, if the display panel 700 is a liquid crystal display panel, the polarizer may include the linear polarizer. In addition, if the display panel 700 is an organic electroluminescence display panel, the polarizer may be the anti-reflective polarizer for the external light.

Referring to FIG. 13, the first and second sub-sensing electrodes 241 and 242 may be formed on the top surface of the display panel 700. In addition, the display panel 700 may be formed on the top surface thereof with the first wire connected with the first sub-sensing electrode 241 and the second wire connected with the second sub-sensing electrode 242.

In addition, an insulating layer 600 may be formed on the first sub-sensing electrode 241 and expose the second sub-sensing electrode 242. A bridge electrode 230 may be further formed on the insulating layer 600 for the connection between second sub-sensing electrodes 242.

However, the embodiment is not limited to the structure shown in the drawings, and the display panel 700 may be formed on the top surface thereof with the first sub-sensing electrode 241, the first wire, and the second wire, and the insulating layer may be formed on the first sub-sensing electrode 241 and the first wire. The insulating layer may be formed thereon with the second sub-sensing electrode 242, and a connection part may be further provided to connect the second sub-sensing electrode 242 with the second wire.

The first and second sub-sensing electrodes 241 and 242 and the first and second wires may be formed in an active area on the top surface of the display panel 700. The first and second sub-sensing electrodes 241 and 242 may be spaced apart from each other while being adjacent to each other. In other words, the insulating layer and the bridge electrode may be omitted.

In other words, the embodiment is not limited to the structure shown in the drawing, but various modifications are possible if the first and second sub-sensing electrodes 241 and 242 are formed on the display panel 700 without an additional sub-sensing electrode support substrate.

The cover substrate 400 may be disposed above the display panel 700 while a bonding layer 68 is interposed between the display panel 700 and the cover substrate 400. In this case, the polarizer may be interposed between the display panel 700 and the cover substrate 400.

In the touch device according to the embodiment, at least one substrate to support the sub-sensing electrode may be omitted. Accordingly, a thin and light touch device can be formed.

Hereinafter, a touch device according to another embodiment will be described with reference to FIGS. 14 to 17. The details of the same structure and elements as those described above will be omitted. The same reference numerals will be assigned to the same elements.

Referring to FIGS. 14 to 17, the touch device according to the present embodiment may include a touch window formed integrally with a display panel. In other words, at least one or all of substrates to support sensing electrodes may be omitted.

A sensing electrode disposed at an active area to serve as a sensor, which senses a touch, and a wire to apply an electrical signal to the sub-sensing electrode may be formed inside the display panel. In more detail, at least one sub-sensing electrode or at least one wire may be formed inside the display panel.

The display panel includes the first and second substrates 701 and 702. In this case, at least one of the first and second sub-sensing electrodes 241 and 242 is interposed between the first and second substrates 701 and 702. In other words, at least one sub-sensing electrode may be formed on at least one surface of the first substrate 701 or the second substrate 702.

Figure 14:
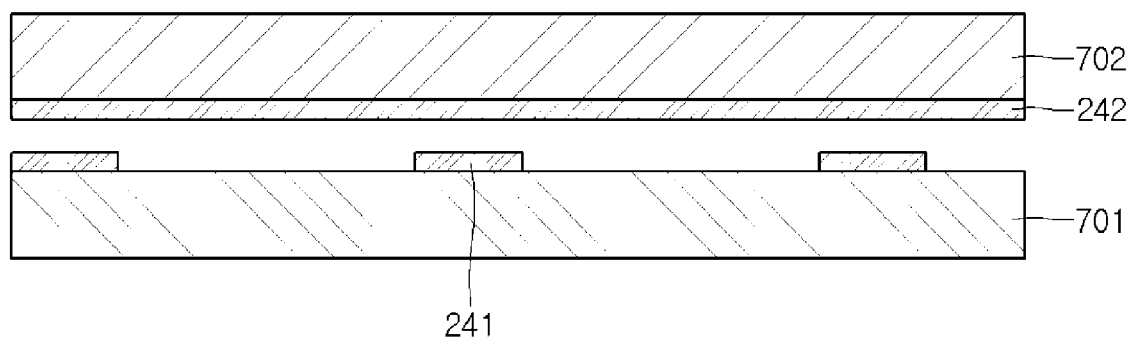
Figure 15:
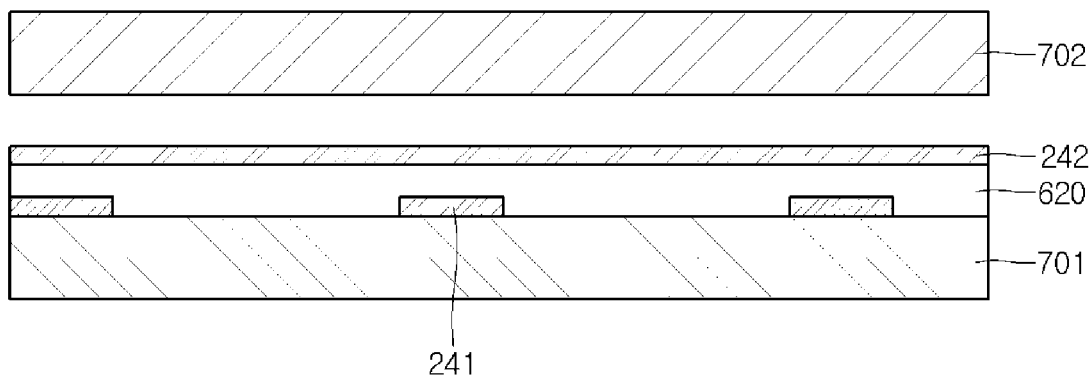
Figure 16:
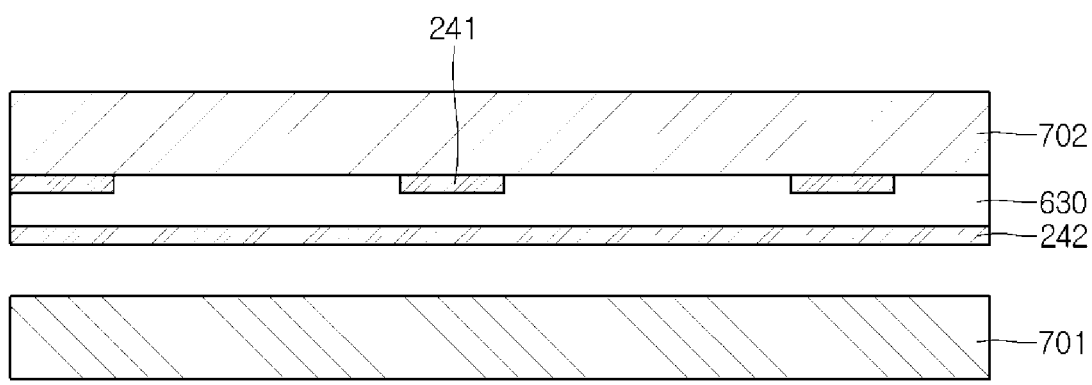

Referring to FIGS. 14 to 16, the first and second sub-sensing electrodes 241 and 242 and first and second wires may be interposed between the first and second substrates 701 and 702. In other words, the first and second sub-sensing electrodes 241 and 242 and the first and second wires may be disposed inside the display panel.

Referring to FIG. 14, the first sub-sensing electrode 241 and the first wire may be formed on the top surface of the first substrate 701 of the display panel, and the second sub-sensing electrode 242 and the second wire may be formed on the bottom surface of the second substrate 702. Referring to FIG. 15, the first and second sub-sensing electrodes 241 and 242 and the first and second wires may be formed on the top surface of the first substrate 701. An insulating layer 620 may be interposed between the first and second sub-sensing electrodes 241 and 242. In addition, referring to FIG. 16, the first and second sub-sensing electrodes 241 and 242 may be formed on the bottom surface of the second substrate 702. An insulating layer 630 may be interposed between the first and second sub-sensing electrodes 241 and 242.

Figure 17:
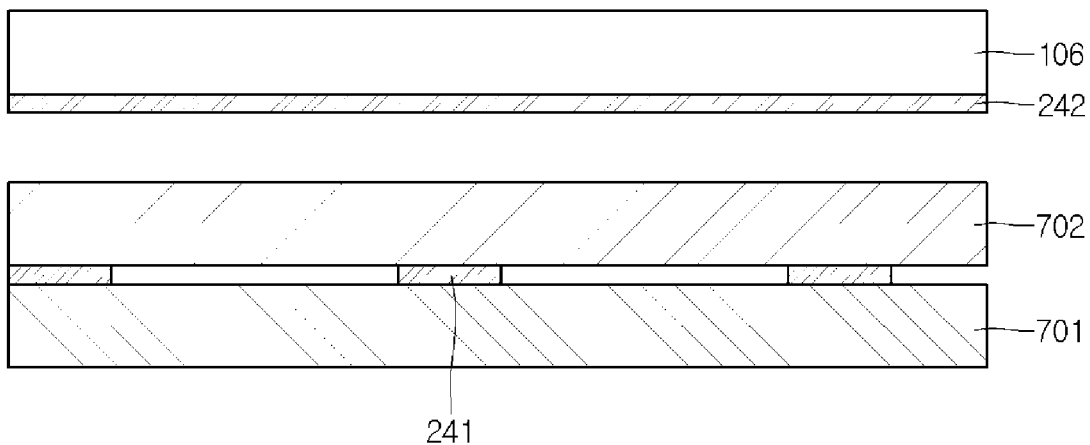

Referring to FIG. 17, the first sub-sensing electrode 241 and the first wire may be interposed between the first and second substrates 701 and 702. In addition, the second sub-sensing electrode 242 and the second wire may be formed on a touch substrate 106. The touch substrate 106 may be disposed on the display panel including the first and second substrates 701 and 702. In other words, the first sub-sensing electrode 241 and the first wire may be disposed inside the display panel, and the second sub-sensing electrode 242 and the second wire may be disposed outside the display panel.

The first sub-sensing electrode 241 and the first wire may be formed on a top surface of the first substrate 701 or a bottom surface of the second substrate 702. In addition, a bonding layer may be interposed between the touch substrate 106 and the display panel. In this case, the touch substrate 105 may serve as the cover substrate.

Although the drawing shows that the second sub-sensing electrode 242 is formed on a bottom surface of the touch substrate 106, the embodiment is not limited thereto. The touch substrate 106 may be formed on a top surface thereof with the second sub-sensing electrode 242, and may be additionally formed on the top surface thereof with a cover substrate that interposes a bonding layer between the cover substrate and the touch substrate 106.

In other words, the embodiment is not limited to the structure shown in the drawing, but various modifications are possible if the first sub-sensing electrode 241 and the first wire are disposed inside the display panel, and the second sub-sensing electrode 242 and the second wire are disposed outside the display panel.

In addition, the touch substrate 106 may be the polarizer. In other words, the second sub-sensing electrode 242 may be formed on top and bottom surfaces of the polarizer. Accordingly, the sensing electrode may be formed integrally with the polarizer.

In addition, the polarizer may be provided independently from the touch substrate 106. In this case, the polarizer may be disposed under the touch substrate 106. For example, the polarizer may be interposed between the touch substrate 105 and the display panel 700. In addition, the polarizer may be disposed above the touch substrate 106.

If the display panel is a liquid crystal display panel, and the sub-sensing electrode is formed on a top surface of the first substrate 701, the sub-sensing electrode may be formed together with a TFT or a pixel electrode. In addition, if the sub-sensing electrode is formed on a bottom surface of the second substrate 702, a color filter layer may be formed on the sub-sensing electrode or the sub-sensing electrode may be formed on the color filter layer. If the display panel is an organic electroluminescence display panel, and the sub-sensing electrode is formed on the top surface of the first substrate 701, the sub-sensing electrode may be formed together with a TFT or an organic light emitting device.

Further, in the touch device according to the embodiment, an additional substrate to support the sub-sensing electrode may be omitted. Accordingly, a thin and light touch device can be formed. In addition, the sensing electrode and the wire are formed together with devices formed on the display panel, so that the process can be simplified and the costs can be saved.

The touch window may be applied to a vehicle as well as a mobile terminal, so that the touch window may be applied to a PND (Personal Navigation Display) such as a vehicle navigator. In addition, the touch window may be applied to a dashboard, so that a CID (Center Information Display) may be implemented. However, the embodiment is not limited to the above, and the display device may be used for various electronic appliances.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch window comprising:
    a substrate including first and second substrates;
    a sensing electrode on the first and second substrates; and
    a wire connected to an end of the sensing electrode;
    wherein the sensing electrode includes a first sensing electrode and a second sensing electrode,
    wherein the first sensing electrode is provided on the first substrate to sense a position; and
    wherein the second sensing electrode is provided on the second substrate to sense a position,
    wherein the first and second sensing electrodes are disposed on a same surface of the substrate,
    wherein the first substrate and the second substrate are formed integrally,
    wherein the second substrate is folded from the first substrate,
    wherein the first and second sensing electrodes include mutually different materials,
    wherein the first sensing electrode includes at least one of indium tin oxide, indium zinc oxide, copper oxide, tin oxide, zinc oxide, or titanium oxide,
    wherein the second sensing electrode includes at least one of a nano wire, a carbon nano tube (CNT), graphene, a conductive polymer, or a metal, and
    wherein the second area is bendable from the first area.

2. The touch window of claim 1, wherein the second substrate surrounds the first area.

3. The touch window of claim 1, wherein the second substrate is provided on both side surfaces of the first substrate.

4. The touch window of claim 1, wherein the second sensing electrode includes a conductive pattern.

5. The touch window of claim 1, wherein the second sensing electrode is provided in a mesh shape.

6. The touch window of claim 1, wherein the second substrate is provided on at least one side surface of the first substrate.

7. The touch window of claim 1, wherein at least one of the first and second sensing electrodes includes a first sub-sensing electrode and a second sub-sensing electrode extending in mutually different directions.

8. The touch window of claim 7, wherein the substrate includes a cover substrate, and
    wherein the first and second sub-sensing electrodes are provided on a same surface of the substrate.

9. The touch window of claim 7, further comprising a cover substrate on the substrate,
    wherein the first and second sub-sensing electrodes are provided on a same surface of the substrate.

10. The touch window of claim 7, further comprising:
    a middle layer on the substrate; and
    a cover substrate on the middle layer,
    wherein the first sub-sensing electrode is provided on the substrate, and
    the second sub-sensing electrode is provided on the middle layer.

11. The touch window of claim 7, further comprising a cover substrate on the substrate,
    wherein the first sub-sensing electrode is provided on the cover substrate, and
    wherein the second sub-sensing electrode is provided on the substrate.

12. The touch window of claim 7, wherein the first sub-sensing electrode is provided on a first surface of the substrate, and
    wherein the second sub-sensing electrode is provided on a second surface of the substrate opposite to the first surface of the substrate.

13. The touch window of claim 7, further comprising another substrate on the substrate; and
    a cover substrate on the another substrate,
    wherein the first sub-sensing electrode is provided on the substrate, and
    wherein the second sub-sensing electrode is provided on the another substrate.

14. A touch device comprising:
    a touch window; and
    a driving unit on the touch window,
    wherein the touch window includes:
        a substrate including first and second substrates;
        a sensing electrode on the first and second substrates; and
        a wire connected to an end of the sensing electrode;
        wherein the sensing electrode includes a first sensing electrode and a second sensing electrode,
        wherein the first sensing electrode is provided on the first substrate to sense a position; and wherein the second sensing electrode is provided on the second substrate to sense a position, wherein the first and second sensing electrodes are provided on a same surface of the substrate, wherein the first substrate and the second substrate are formed integrally, wherein the second substrate is folded from the first substrate, wherein the first and second sensing electrodes include mutually different materials, wherein the first sensing electrode includes at least one of indium tin oxide, indium zinc oxide, copper oxide, tin oxide, zinc oxide, or titanium oxide, wherein the second sensing electrode includes at least one of a nano wire, a carbon nano tube (CNT), graphene, a conductive polymer, or a metal, and wherein the second area is bendable from the first area.

\* \* \* \* \*